United States Patent
Lee

(10) Patent No.: US 7,319,445 B2
(45) Date of Patent: Jan. 15, 2008

(54) ACTIVE MATRIX TYPE ORGANIC ELECTROLUMINESCENCE DEVICE

(75) Inventor: Ul-Ho Lee, Yongin-si (KR)

(73) Assignee: Samsung SDI Co., Ltd., Suwon-si (KR)

(*) Notice: Subject to any disclaimer, the term of this patent is extended or adjusted under 35 U.S.C. 154(b) by 709 days.

(21) Appl. No.: 10/915,569

(22) Filed: Aug. 11, 2004

(65) Prior Publication Data
US 2005/0099369 A1 May 12, 2005

(30) Foreign Application Priority Data
Nov. 12, 2003 (KR) .................. 10-2003-0079900

(51) Int. Cl.
*G09G 3/30* (2006.01)
(52) U.S. Cl. ........................................ 345/76
(58) Field of Classification Search .............. 345/76, 345/80, 87, 92; 313/505, 311; 257/83, 84; 315/169.3; 445/24
See application file for complete search history.

(56) References Cited

U.S. PATENT DOCUMENTS

| 6,395,411 | B1 | 5/2002 | Kwon et al. |
| 6,690,110 | B1 | 2/2004 | Yamada et al. |
| 6,911,960 | B1 | 6/2005 | Yokoyama |
| 2002/0180371 | A1 | 12/2002 | Yamazaki et al. |
| 2003/0089991 | A1 | 5/2003 | Yamazaki et al. |
| 2003/0214042 | A1 | 11/2003 | Miyazawa |

FOREIGN PATENT DOCUMENTS

| JP | 2000-77666 | 3/2000 |
| JP | 2000-143569 | 5/2000 |
| JP | 2000-173779 | 6/2000 |
| JP | 2000-357584 | 12/2000 |
| JP | 2001-109395 | 4/2001 |
| JP | 2003-73666 | 3/2003 |
| JP | 2003-316296 | 11/2003 |

OTHER PUBLICATIONS

Search Report issued on Feb. 12, 2007 by the European Patent Office for European Patent Application No. 04255995.5-1235.
Office Action issued in Japanese Patent Application No. 2004-236500 on Nov. 7, 2006.

*Primary Examiner*—Richard Hjerpe
*Assistant Examiner*—Abbas I. Abdulselam
(74) *Attorney, Agent, or Firm*—Stein, McEwen & Bui, LLP

(57) ABSTRACT

An active matrix type organic electroluminescence device having a plurality of sub-pixels disposed on a substrate, wherein each of the sub-pixels includes a first thin film transistor driven by a driving circuit, a second thin film transistor driven by the first thin film transistor, and a display portion driven by the second thin film transistor; the display portion includes a first electrode to receive a first electric charge from the second thin film transistor, a second electrode to receive a second electric charge from a second electrode connecting terminal disposed outside of the sub-pixel, a light emitting layer interposed between the first electrode and the second electrode, and an electric charge transfoer layer interposed between the light emitting layer and at least one of the first and the second electrodes; and the second electrode and the second electrode connecting terminal are directly electrically connected.

33 Claims, 6 Drawing Sheets

III

ACTIVE MATRIX TYPE ORGANIC ELECTROLUMINESCENCE DEVICE

CROSS-REFERENCE TO RELATED APPLICATIONS

This application claims the priority of Korean Patent Application No. 2003-79900, filed on Nov. 12, 2003, in the Korean Intellectual Property Office, the disclosure of which is incorporated herein by reference.

BACKGROUND OF THE INVENTION

1. Field of the Invention

The present invention relates to an active matrix type organic electroluminescence device, and, more particularly, to an active matrix type organic electroluminescence device having a reduced contact resistance between an electrode and an electrode connecting terminal. This organic electroluminescence device has a superior brightness, contrast, and viewing angle compared to a conventional display device.

2. Description of the Related Art

FIG. 1 is a cross-sectional view of a sub-pixel and a connecting region A adjacent to the sub-pixel. The connecting region denotes a region for an electrical connection between a second electrode 62 and a second electrode connecting terminal 90, and the connecting region does not belong to the sub-pixel.

As illustrated in FIG. 1, electric charge transfer layers 87a and/or 87c are interposed between the second electrode 62 and the second electrode connecting terminal 90 in the conventional organic electroluminescence device. When the electric charge transfer layers 87a and/or 87c are formed of lithium fluoride, calcium, or barium, a resistance between the second electrode 62 and the second electrode connecting terminal 90 becomes large. In this case, due to the high resistance, electrical power may not be supplied to the second electrode 62, or the power consumption incurred by the resistance may increase.

SUMMARY OF THE INVENTION

The present invention provides an active matrix type organic electroluminescence device having high reliability and reduced power consumption.

Additional aspects and/or advantages of the invention will be set forth in part in the description which follows and, in part, will be obvious from the description, or may be learned by practice of the invention.

According to an aspect of the present invention, an active matrix type organic electroluminescence device includes a plurality of sub-pixels disposed on a substrate, wherein each sub-pixel comprises a first thin film transistor driven by a driving circuit, a second thin film transistor driven by the first thin film transistor, and a display portion driven by the second thin film transistor.

The display portion comprises a first electrode to receive a first electric charge from the second thin film transistor, a second electrode to receive a second electric charge from a second electrode connecting terminal disposed outside of the sub-pixel, a light emitting layer interposed between the first electrode and the second electrode, and an electric charge transfer layer interposed between the light emitting layer and at least one of the first and the second electrodes. The second electrode and the second electrode connecting terminal are directly electrically connected.

According to another aspect of the present invention, an active matrix type organic electroluminescence device includes a plurality of sub-pixels disposed on a substrate, wherein each sub-pixel comprises a first thin film transistor driven by a driving circuit, a second thin film transistor driven by the first thin film transistor, and a display portion driven by the second thin film transistor.

The display portion comprises a first electrode to receive a first electric charge from the second thin film transistor, a second electrode to receive a second electric charge from a second electrode connecting terminal disposed outside of the sub-pixel, a light emitting layer interposed between the first electrode and the second electrode, and an electric charge transfer layer interposed between the light emitting layer and at least one of the first and the second electrodes. The second electrode and the second electrode connecting terminal are electrically connected only via an inorganic conductive intermediate layer.

A surface material of the second electrode that faces the second electrode connecting terminal may be different from a surface material of the second electrode connecting terminal that faces the second electrode.

The inorganic conductive intermediate layer may comprise an oxide layer. The oxide layer may be formed by a transparent conductive oxide. The transparent conductive oxide may comprise at least one of ITO, IZO, $In_2O_3$, and ZnO.

The second electrode may comprise a metal selected from the group consisting of lithium, magnesium, aluminum, aluminum-lithium, calcium, magnesium-indium, and magnesium-silver.

The second electrode connecting terminal may comprise aluminum.

The electric charge transfer layer may comprise an electric charge transport layer.

The electric charge transport layer may comprise a hole transport layer formed of at least one of N, N'-bis(3-methylphenyl)-N,N'-diphenyl-4, 4'-diamine(TPD) and N,N'-di(naphthalene-1-yl)-N, N'-diphenyl-benxidine: α-NPD, and may comprise an electron transport layer formed of at least one of A-oxazole compounds, isooxazole compounds, triazole compounds, isothiazole compounds, oxadiazole compounds, thiadizole compounds, perylene compounds, aluminum complex, and gallium complex.

The electric charge transfer layer may comprise an electric charge injection layer.

The electric charge injection layer may comprise a hole injection layer formed of at least of one of CuPu and a starburst type amine, and may comprise an electron injection layer formed of at least one of LiF, NaCl, CsF, $Li_2O$, and BaO.

The first thin film transistor and the second thin film transistor may be formed on a buffer layer on the substrate and covered by an insulating layer, and the first electrode may be connected to the second thin film transistor through a contact hole formed on the insulating layer.

A planarization layer may be formed on portions of the first electrode and the insulating layer disposed outside of the display portion of the sub-pixel.

A protective layer may be formed on the second electrode.

A gate electrode and a source electrode of the first thin film transistor, a source electrode of the second thin film transistor, and the second electrode may be connected to the driving circuit, and a drain electrode of the first thin film transistor may be connected to a gate electrode of the second thin film transistor.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
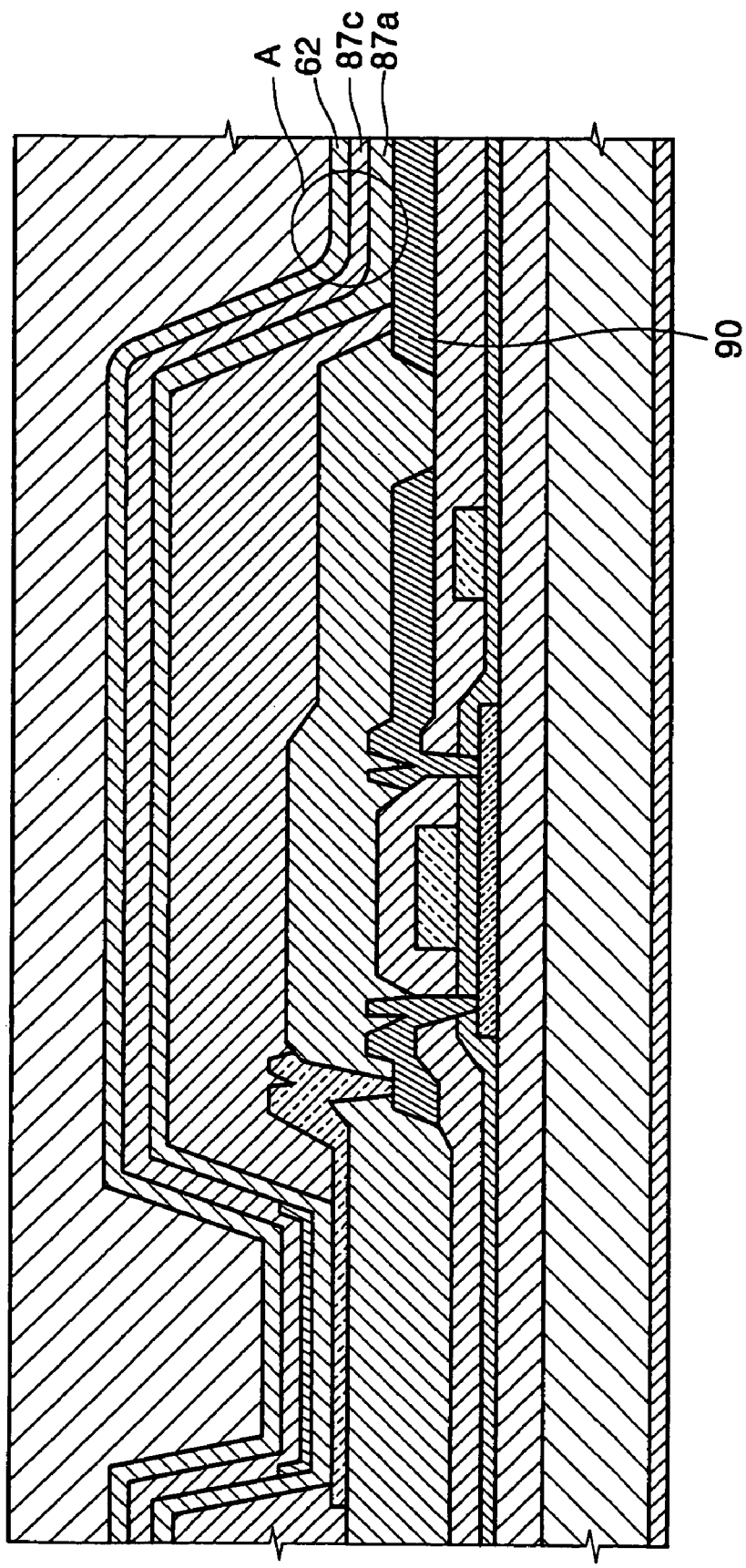
FIG. 1 is a cross-sectional view of a sub-pixel of a conventional active matrix type electroluminescence device.

Reference will now be made in detail to the embodiments of the present invention, examples of which are illustrated in the accompanying drawings, wherein like reference numerals refer to the like elements throughout. The embodiments are described below to explain the present invention by referring to the figures.

Referring to FIGS. 2 through 5, an organic electroluminescence device according to an embodiment of the present invention will be described.

Figure 2:
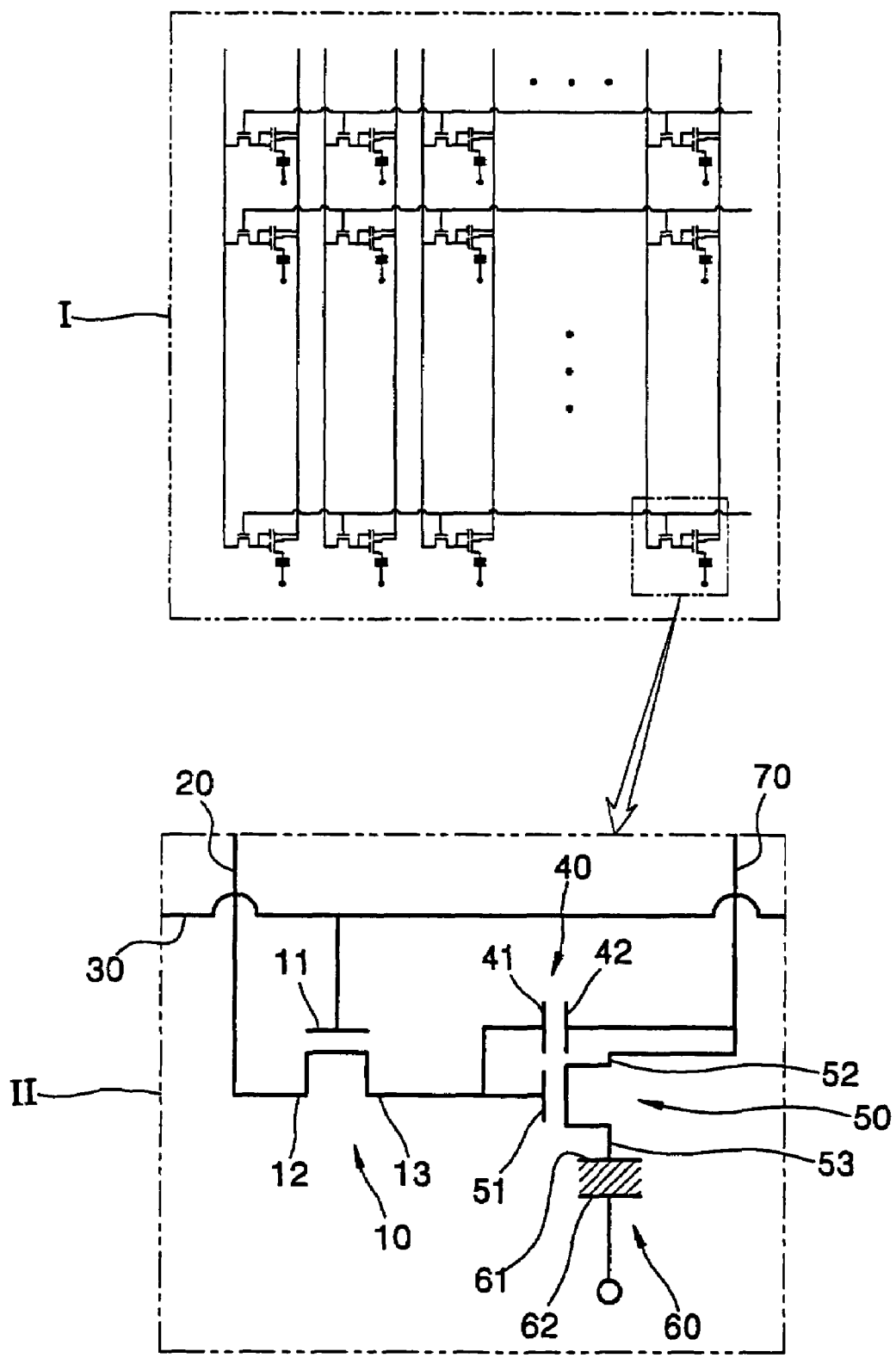
FIG. 2 is a circuit diagram of an active matrix type electroluminescence device.

FIG. 2 illustrates a circuit having sub-pixels disposed on a substrate of an electroluminescence device. Each sub-pixel comprises a first thin film transistor 10 driven by a driving circuit (not shown), a second thin film transistor 50 driven by the first thin film transistor 10, and a display portion 60 driven by the second thin film transistor 50. The driving circuit may be disposed on a peripheral portion of the substrate, or may be disposed other than on the substerate.

A first source electrode 12 of the first thin film transistor 10 is connected to the driving circuit (not shown) by a first conductive line 20. A first gate electrode 11 of the first thin film transistor 10 is connected to the driving circuit by a second conductive line 30. A first drain electrode 13 of the first thin film transistor 10 is connected to a first capacitor electrode 41 of a storage capacitor 40 and a second gate electrode 51 of the second thin film transistor 50.

Figure 5:
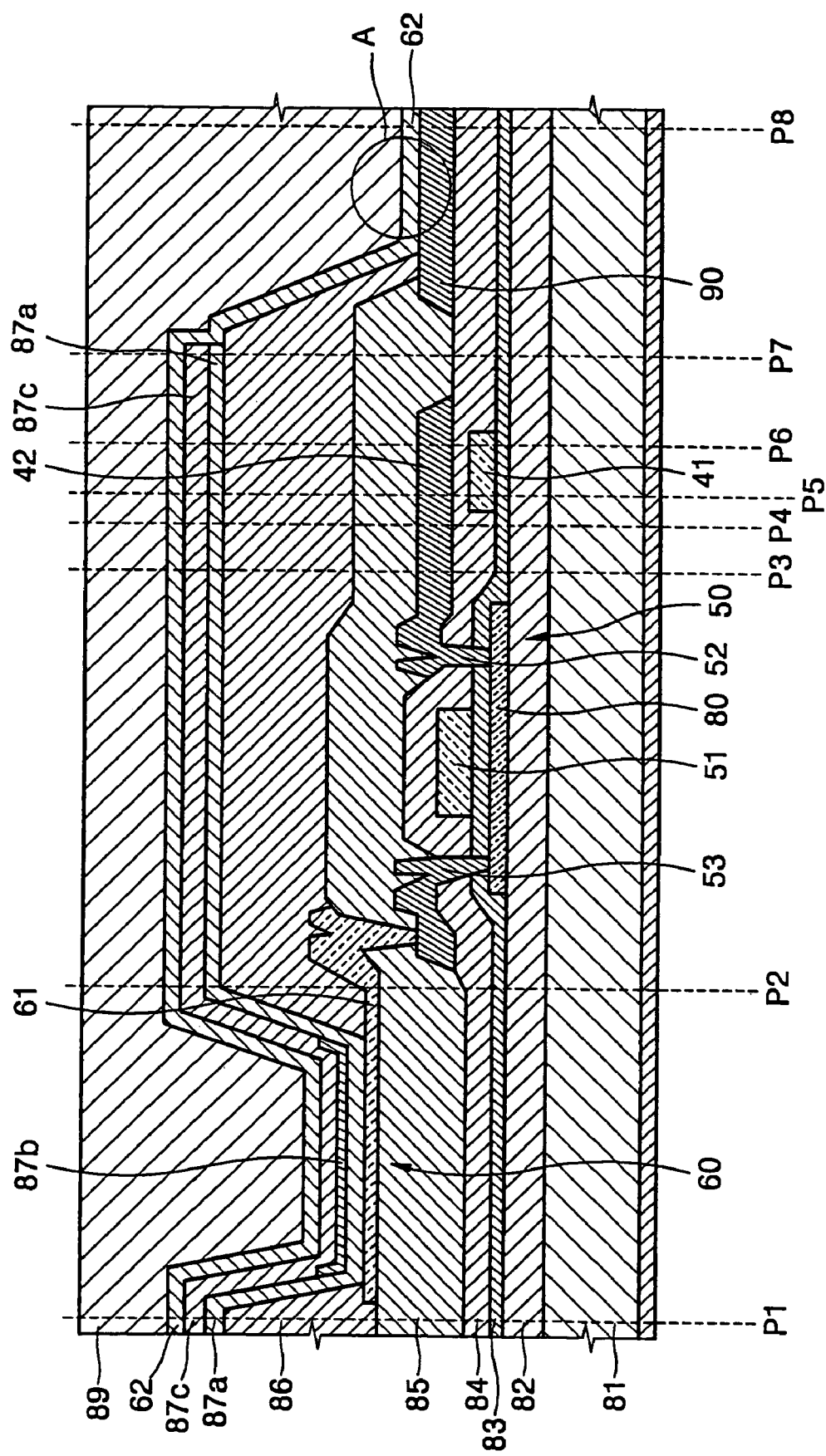
FIG. 5 is a cross-sectional view of a sub-pixel according to an embodiment of the present invention taken along line P1 through P8 in FIG. 4.

A second capacitor electrode 42 of the storage capacitor 40 and a second source electrode 52 are connected to a third conductive line 70, and a second drain electrode 53 of the second thin film transistor 50 is connected to a first electrode 61 of the display portion 60. As shown in FIG. 5, a second electrode 62 of the display portion 60 is disposed at a predetermined distance from the first electrode 61. A light emitting layer 87b and at least an electric charge transfer layer 87a and/or an electric charge carrier layer 87c are disposed between the first electrode 61 and the second electrode 62.

Figure 3:
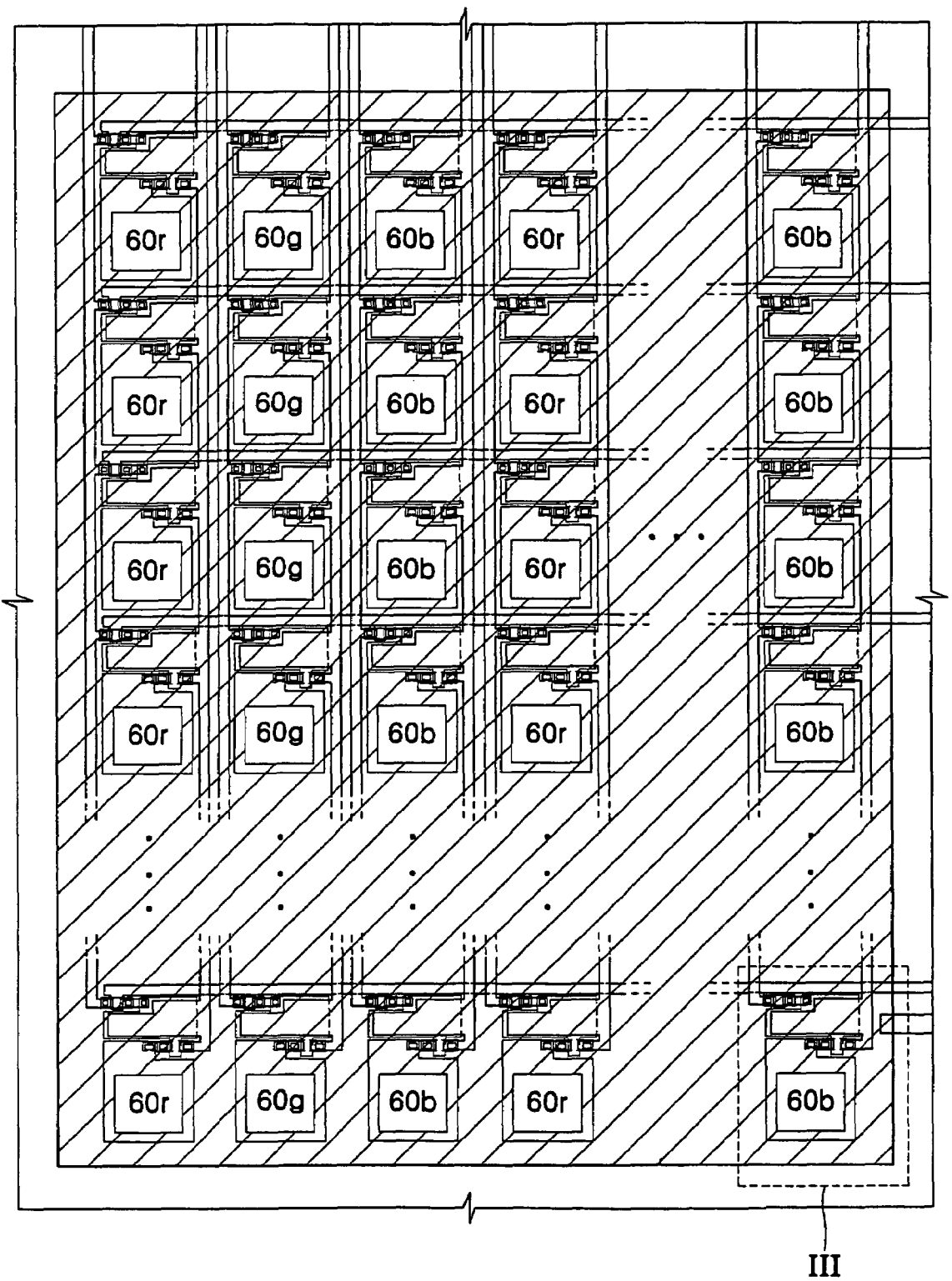
FIG. 3 illustrates a physical structure of an organic electroluminescence display device according to an embodiment of the present invention.

FIG. 3 illustrates a physical structure of an organic electroluminescent display device according to an embodiment of the present invention. Portion III of FIG. 3 corresponds to portion 11 in FIG. 2. For clarity of drawing, a substrate 81, a buffer layer 82, a first insulating layer 83, a second insulating layer 84, a third insulating layer 85, a planarization layer 86, a first electric charge transfer layer 87a, a light emitting layer 87b, a second electric charge transfer layer 87c, the second electrode 62, and a protecting layer 89, which are shown in FIG. 5, are not shown in FIG. 3. As shown in FIG. 3, each sub-pixel has one of a red display portion 60r, a green display portion 60g, and a blue display portion 60b, and an image is formed according to light emissions of these display portions 60r, 60g, and 60b.

Figure 4:
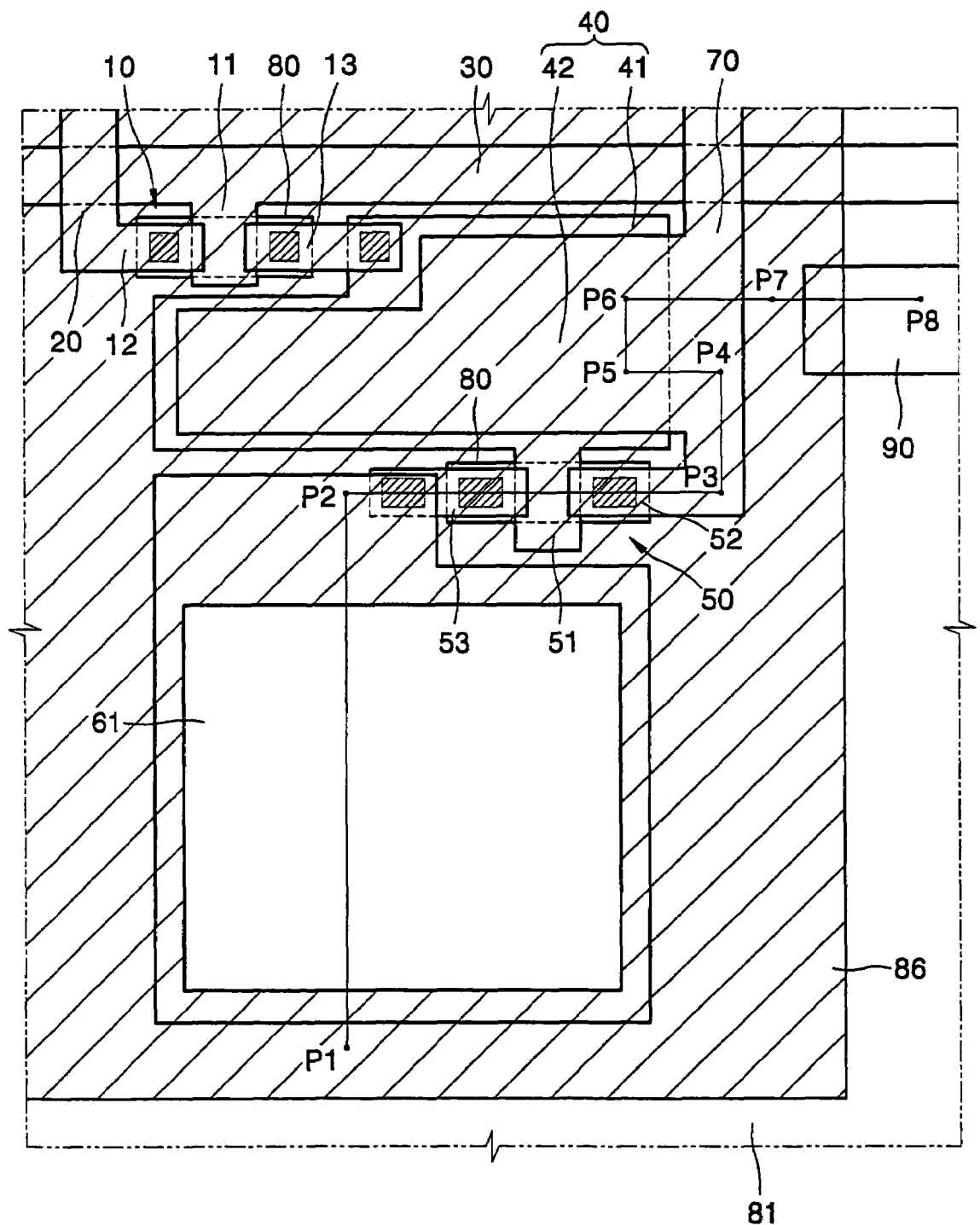
FIG. 4 illustrates a more detailed physical structure of portion III of FIG. 3.

FIG. 4 illustrates a more detailed physical structure of the portion III of FIG. 3. The overlapping portions of components in FIG. 4, except the portions shown with narrowly slashed boxes, are insulated from each other.

When a voltage is applied to the first gate electrode 11 by the driving circuit (not shown), a conductive channel is formed in a semiconductor layer 80 which connects the first source electrode 12 and the first drain electrode 13. At this time, an electric charge is supplied to the first source electrode 12 by the first conductive wire 20, and the electric charge is then transferred to the first drain electrode 13. When an electric charge that determines the amount of light emitted by the light emitting layer 87b is applied to the third conductive line 70, and when an electric charge is applied to the second gate electrode 51 by the first drain electrode 13, an electric charge of the second source electrode 52 is transferred to the first electrode 61 through the second drain electrode 53.

For reference, the cross-sectional structure of the first thin film transistor 10 and that of the second thin film transistor 50 are similar to each other in this embodiment, but the present invention is not limited to this structure.

Referring to FIG. 5, a detailed configuration of the sub-pixel according to this embodiment of the present invention will be described. The display portion 60 of the sub-pixel is located between lines P1 and P2, the second thin film transistor 50 is located between lines P2 and P3, and the storage capacitor 40 is located between lines P3 and P7. FIG. 5 also illustrates a connecting region A wherein the second electrode 62 and a second electrode connecting terminal 90 are directly connected.

As illustrated in FIG. 5, a buffer layer 82 is formed on a substrate 81, a semiconductor layer 80, formed of a semiconductor material such as silicon, is formed in a predetermined pattern on the buffer layer 82, and a first insulating layer 83 is formed without being patterned to cover the semiconductor layer 80. On the first insulating layer 83, first and second gate electrodes 11 and 51 and a lower electrode 41 of the storage capacitor 40 are formed in a predetermined pattern, and a second insulating layer 84 is formed without being patterned to cover the first and second gate electrodes 11 and 51 and the lower electrode 41.

Contact holes are formed in predetermined portions of the first insulating layer 83 and the second insulating layer 84, the predetermined portions being located at both lateral ends of the first and second gate electrodes 11 and 51. Also, on a region including the region in which the contact holes are formed, a first source electrode 12, a second source electrode 52, a first drain electrode 13, a second drain electrode 53, and a second electrode connecting terminal 90 are formed in a predetermined pattern.

Afterward, a third insulating layer 85 is formed without being patterned to cover the first source electrode 12, the second source electrode 52, the first drain electrode 13, and the second drain electrode 53. At least a portion of the second electrode connecting terminal 90 is not covered by the third insulating layer 85.

The semiconductor layer 80, the first insulating layer 83, the first gate electrode layer 11, the second insulating layer 84, the first source electrode 12, and the first drain electrode 13 constitute the first thin film transistor 10. The semiconductor layer 80, the first insulating layer 83, the second gate electrode 51, the second insulating layer 84, the second source electrode 52, and the second drain electrode 53 constitute the second thin film transistor 50.

A contact hole is formed in the third insulating layer 85 at a region corresponding to the second drain region electrode 53, and a first electrode 61 is formed in a predetermined region including the region in which the contact hole is formed. The first electrode 61 is connected to the second drain electrode 53 of the second thin film transistor 50 through the contact hole formed in the third insulating layer 85.

The first gate electrode 11 and the first source electrode 12 of the first thin film transistor 10, the second source electrode 52 of the second thin film transistor 50, and the second electrode 62 are connected to a driving circuit (not shown). The first drain electrode 13 of the first thin film transistor 10 is connected to the second gate electrode 51 of the second thin film transistor 50.

The second source electrode 52 is connected to the third conductive line 70, the second drain electrode 53 is connected to the first electrode 61, the first source electrode 12 of the first thin film transistor 10 is connected to the first conductive line 20, and the first gate electrode 11 is connected to the second conductive line 30. In this embodiment of the present invention, the first conductive line 20 corresponds to a data transmission line, and the second conductive line 30 corresponds to a scan line.

The thin film transistors 10 and 50 of this embodiment of the present invention may be a stagger type, an inverted stagger type, a coplanar type, or an inverted coplanar type. In this embodiment, the coplanar type is adopted as an example, but the present invention is not limited thereto.

A planarization layer 86 may be formed without being patterned on a portion of the first electrode 61 and the third insulating layer 85 disposed on the outer region of the display portion, but the planarization layer 86 may be omitted. In the case in which the planarization layer 86 is formed, the second electrode connecting terminal 90 is not covered by the planarization layer 86.

Also, in the case in which the planarization layer 86 is formed, a first electric charge transfer layer 87a is formed on the portion of the first electrode 61 which is not covered by the planarization layer 86, a light emitting layer 87b is formed on the first electric charge transfer layer 87a located in the display portion 60, and a second electric charge transfer layer 87c is formed on the light emitting layer 87b and a portion of the first electric charge transfer layer 87a which is not covered by the light emitting layer 87b. Any one of the first electric charge transfer layer 87a and the second electric charge transfer layer 87c may be omitted.

In the case in which the second electric charge transfer layer 87c is formed, the second electrode 62 is formed on the second electric charge transfer layer 87c and the second electrode connecting terminal 90. Accordingly, the second electrode 62 is directly electrically connected to the second electrode connecting terminal 90. A protective layer 89 may be formed on the second electrode 62.

In the case in which the electroluminescence device is a bottom emission type, the substrate 81, the buffer layer 82, the first insulating layer 83, the second insulating layer 84, the third insulating layer 85, the first electrode 61, the first electric charge transfer layer 87a, and the second electric charge transfer layer 87c may be formed of a transparent material, and the second electrode 62 may be formed of a metal selected from the group consisting of lithium, magnesium, aluminum, aluminum-lithium, calcium, magnesium-indium, and magnesium-silver. In the case in which the electroluminescence device is a top emission type, the first electrode 61 may be formed of a metal having a high light reflectance, and the first electric charge transfer layer 87a, the second electric charge transfer layer 87c, the second electrode 62, and the protective layer 89 may be formed of a transparent material.

The display portion 60 comprises a first electrode 61 which receives an electric charge from the second drain electrode 53 of the second thin film transistor 50, the second electrode 62 which receives an electric charge from the second electrode connecting terminal 90, a light emitting layer 87b interposed between the first electrode 61 and the second electrode 62, the electric charge transfer layer 87a and/or 87c interposed between one of the first and second electrode 61 and 62, and the light emitting layer 87b.

Materials for the light emitting layer 87b may be low molecule organic materials such as copper phthalocyanine (CuPu), N,N'-di(naphthalene-1-yl)-N,N'-diphenyl-benzidine (NPB), and tris-8-hydroxyquinoline aluminum)(Alq3), or high molecule organic material such as poly-phenylenevinylene (PPV) and polyfluorene. When an electric charge is applied to the first electrode 61 and the second electrode 62, excitons are produced by a combination of the holes and electrons. The light emitting layer 87b emits light when the energy of excitons is lowered.

Each of the first and second electric charge transfer layer 87a and 87c may comprise an electric charge injection layer which is formed of a component that can inject charge fluently, and/or an electric charge transport layer which can transport charge fluently. The electric charge injection layer can be classified into an electron charge injection layer and a hole injection layer, and the electric charge transport layer can be classified into an electron charge transport layer and a hole transport layer. The electron charge injection layer can be formed of a material selected from the group consisting of lithium fluoride, calcium, and barium.

The storage capacitor 40 comprises a lower electrode 41 and an upper electrode 42. The lower electrode 41 can be formed in one body with the second gate electrode 51, and the upper electrode 42 can be formed in one body with the second source electrode 52.

When the first electrode 61 is an anode and the second electrode 62 is a cathode, the first electric charge transfer layer 87a becomes a hole transfer layer, and the second electric charge transfer layer 87c becomes an electron transfer layer. The hole transfer layer may comprise a hole injection layer and a hole transport layer. The hole injection layer may be formed of a material selected from the group consisting of CuPu and amines of a starburst type such as TCTA, m-MTDATA, and m-MTDAPB. The hole transport layer can be formed of, for example, N,N'-bis(3-methylphenyl)-N, N'-diphenyl-4,4'-diamine(TPD), or N, N'-di(naphthalene-1-yl)-N,N'-diphenyl-benxidine: α-NPD. The electron transfer layer may comprise an electron injection layer and an electron transport layer. The electron injection layer may be formed of a material selected from the group consisting of LiF, NaCl, CsF, $Li_2O$, and BaO. The electron transport layer may be formed of A-oxazole compounds, isooxazole compounds, triazole compounds, isothiazole compounds, oxadiazole compounds, thiadizole compounds, perylene compounds, aluminum complex such as tris(8-quinolinolato)-aluminium) BAlq, SAlq, and Almq3, and gallium complex such as Gaq'2OPiv, Gaq'2OAc, and 2(Gaq'2).

When the electroluminescence device according to this embodiment of the present invention is a bottom emission type, the first electrode may be formed of a transparent and conductive material like ITO, and the second electrode may be formed of a material having a high reflectance and conductivity such as lithium, magnesium, aluminum, aluminum-lithium, calcium, magnesium-indium, and magnesium-silver. Conversely, when the electroluminescence device is a top emission type, the first electrode may be formed of a material having a high reflectance and conductivity such as lithium, magnesium, aluminum, aluminum-lithium, calcium, magnesium-indium, and magnesium-silver, and the second electrode may be formed of a transparent and conductive material like ITO.

The second electrode connecting terminal 90 may be formed of the same material as the first and second gate electrodes, the first and second source electrode, or the first and the second drain electrodes. The second electrode connecting terminal 90 can be a single layer formed of aluminum, an aluminum alloy, or MoW, or a stacked layer of MoW/AlNd, Ti/Al/Ti, Ti/Al alloy/Ti, Ti/TiN/Al/TiN/Ti, Ti/TiN/Al alloy/TiN/Ti, TiN/Al, TiN/Ti/Al, or TiN/Al/Ti.

When an electric charge transfer layer is interposed between the second electrode 62 and the second electrode connecting terminal 90, the resistance between the second electrode 62 and the second electrode connecting terminal 90 may become large because the components constituting the electric charge transfer layer have poor conductivity. The electric charge transfer layer may be changed into an insulating layer due to unintended oxidation during manufacturing. In this case, the power supply to the second electrode 62 may become poor, or at least the power consumption at the electric charge transfer layer may increase significantly. However, since the second electrode 62 and the second electrode connecting terminal 90 according to these embodiments of the present invention are directly contacted, the foregoing problems are solved.

The electric charge transfer layer is formed over all sub-pixels. However, as depicted in FIG. 5, the electric charge transfer layer is not formed on the connecting region A. In order to form the electric charge transfer layer as described, a square shaped mask having a large square opening in the center may be used during deposition of the electric charge transfer layer. Because a rim of the mask is disposed above the connecting region A, the electric charge transfer layer is not formed on the connecting region A.

Figure 6:
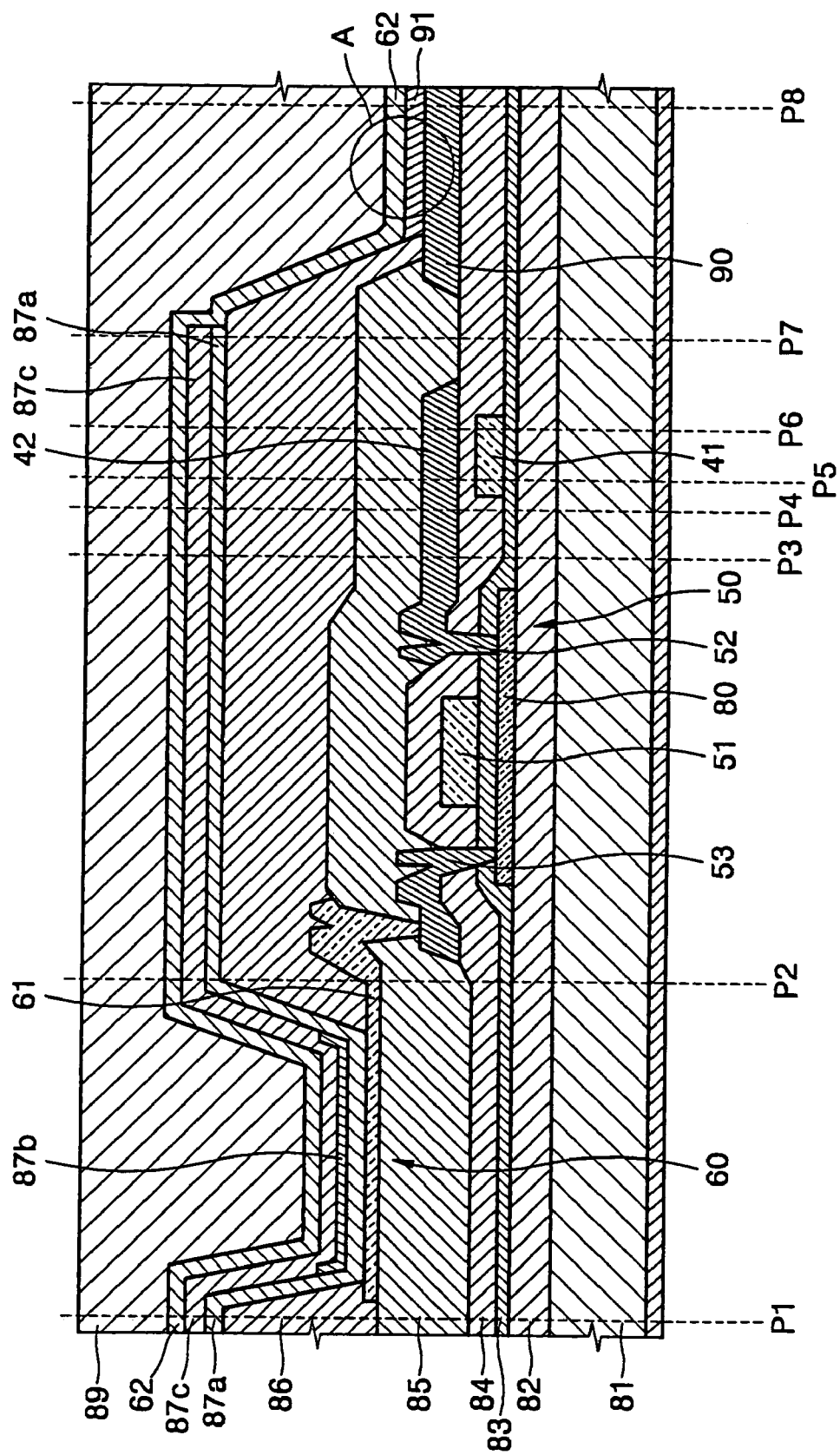
FIG. 6 is a cross-sectional view of a sub-pixel according to another embodiment of the present invention taken along line P1 through P8 in FIG. 4.

FIG. 6 shows an organic electroluminescence device according to another embodiment of the present invention. The difference with respect to the electroluminescence device of the previously discussed embodiments is that, as shown in FIG. 6, the second electrode 62 and the second electrode connecting terminal 90 are electrically connected only via an inorganic conductive intermediate layer 91. That is, in the previous embodiments, the second electrode 62 and the second electrode connecting terminal 90 are directly electrically connected, but in this embodiment, the second electrode 62 and the second electrode connecting terminal 90 are electrically connected only via the inorganic conductive intermediate layer 91 interposed therebetween.

When a surface material (for example, aluminum) of the second electrode 62, which faces the second electrode connecting terminal 90, is different from a surface material (for example, aluminum or nitride titan) of the second electrode connecting terminal 90, which faces the second electrode 62, and they are in direct contact, the contact resistance at the contacting surface often becomes large. In this case, the contact resistance between the second electrode 62 and the second electrode connecting terminal 90 can be reduced by interposing the inorganic conductive intermediate layer 91. The inorganic conductive intermediate layer 91 is a material layer formed of a material having low contact resistances with the surface material of the second electrode 62 and the surface material of the second electrode connecting terminal 90. The inorganic conductive intermediate layer 91 may be an oxide layer, and the oxide layer may be formed by a transparent conductive oxide such as ITO, IZO, In2O3, and ZnO, etc. The inorganic conductive intermediate layer 91 can be formed at the same time that the first electrode 61 is formed.

The present invention provides an organic electroluminescence device that reduces a possibility of producing a poor quality product and high power consumption.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An active matrix type organic electroluminescence device having a plurality of sub-pixels disposed on a substrate, wherein:
    each of the sub-pixels comprises:
        a first thin film transistor driven by a driving circuit,
        a second thin film transistor driven by the first thin film transistor, and
        a display portion driven by the second thin film transistor;
    the display portion comprises:
        a first electrode to receive a first electric charge from the second thin film transistor,
        a second electrode to receive a second electric charge from a second electrode connecting terminal disposed outside of the sub-pixel,
        a light emitting layer interposed between the first electrode and the second electrode, and
        an electric charge transfer layer interposed between the light emitting layer and at least one of the first and the second electrodes,
        wherein the electric charge transfer layer and the second electrode are shared by at lest two sub-pixels; and
    the second electrode and the second electrode connecting terminal are directly electrically connected.

2. The active matrix type organic electroluminescence device of claim 1, wherein the second electrode comprises a metal selected from the group consisting of lithium, magnesium, aluminum, aluminum-lithium, calcium, magnesium-indium, and magnesium-silver.

3. The active matrix type organic electroluminescence device of claim 1, wherein the second electrode connecting terminal is a single layer comprising a material selected from the group consisting of aluminum, an aluminum alloy, and MoW.

4. The active matrix type organic electroluminescence device of claim 1, wherein the second electrode connecting terminal is comprised of a plurality of stacked layers selected from the group consisting of MoW/AlNd, Ti/Al/Ti, Ti/Al alloy/Ti, Ti/TiN/Al/TiN/Ti, Ti/TiN/Al alloy/TiN/Ti, TiN/Al, TiN/Ti/Al, and TiN/Al/Ti.

5. The active matrix type organic electroluminescence device of claim 1, wherein the electric charge transfer layer comprises an electric charge transport layer.

6. The active matrix type organic electroluminescence device of claim 5, wherein the electric charge transport layer comprises a hole transport layer formed of at least one of N,N'-bis(3-methylphenyl)-N,N'-diphenyl-4,4'-diamine (TPD) and N,N'-di(naphthalene-1-yl)-N,N'-diphenyl-benxidine: α-NPD.

7. The active matrix type organic electroluminescence device of claim 5, wherein the electric charge transport layer comprises an electron transport layer formed of at least one of A-oxazole compounds, isooxazole compounds, triazole compounds, isothiazole compounds, oxadiazole compounds, thiadizole compounds, perylene compounds, aluminum complex, and gallium complex.

8. The active matrix type organic electroluminescence device of claim 1, wherein the electric charge transfer layer comprises an electric charge injection layer.

9. The active matrix type organic electroluminescence device of claim 8, wherein the electric charge injection layer comprises a hole injection layer formed of at least one of CuPu and a starburst type amine.

10. The active matrix type organic electroluminescence device of claim 8, wherein the electric charge injection layer comprises an electron injection layer formed of at least one of LiF, NaCl, CsF, $Li_2O$, and BaO.

11. The active matrix type organic electroluminescence device of claim 1, further comprising:
a buffer layer formed on the substrate; and
an insulating layer;
wherein the first thin film transistor and the second thin film transistor are formed on the buffer layer and are covered by the insulating layer, and the first electrode is connected to the second thin film transistor through a contact hole formed on the insulating layer.

12. The active matrix type organic electroluminescence device of claim 1, further comprising:
a planarization layer; and
an insulating layer formed below the first electrode;
wherein the planarization layer is formed on portions of the first electrode and the insulating layer disposed outside of the display portion of the sub-pixel.

13. The active matrix type organic electroluminescence device of claim 1, further comprising a protective layer formed on the second electrode.

14. The active matrix type organic electroluminescence device of claim 1, wherein a gate electrode and a source electrode of the first thin film transistor, a source electrode of the second thin film transistor, and the second electrode are connected to the driving circuit, and a drain electrode of the first thin film transistor is connected to a gate electrode of the second thin film transistor.

15. The active matrix type organic electroluminescence device of claim 1, wherein the second electrode connecting terminal is formed of a same material as gate electrodes of the first and second thin film transistors, source electrodes of the first and second thin film transistors, or drain electrodes of the first and second thin film transistors.

16. An active matrix type organic electroluminescence device having a plurality of sub-pixels disposed on a substrate, wherein:
each of the sub-pixels comprises:
a first thin film transistor driven by a driving circuit,
a second thin film transistor driven by the first thin film transistor, and
a display portion driven by the second thin film transistor;
the display portion comprises:
a first electrode to receive a first electric charge from the second thin film transistor,
a second electrode to receive a second electric charge from a second electrode connecting terminal disposed outside of the sub-pixel,
a light emitting layer interposed between the first electrode and the second electrode, and
an electric charge transfer layer interposed between the light emitting layer and at least one of the first and the second electrodes,
wherein the electric charge transfer layer and the second electrode are shared by at lest two sub-pixels; and
the second electrode and the second electrode connecting terminal are electrically connected only via an inorganic conductive intermediate layer.

17. The active matrix type organic electroluminescence device of claim 16, wherein a surface material of the second electrode that faces the second electrode connecting terminal is different from a surface material of the second electrode connecting terminal that faces the second electrode.

18. The active matrix type organic electroluminescence device of claim 16, wherein the inorganic conductive intermediate layer comprises an oxide layer.

19. The active matrix type organic electroluminescence device of claim 18, wherein the oxide layer is formed of a transparent conductive oxide.

20. The active matrix type organic electroluminescence device of claim 19, wherein the transparent conductive oxide comprises at least one of ITO, IZO, $In_2O_3$, and ZnO.

21. The active matrix type organic electroluminescence device of claim 16, wherein the second electrode comprises a metal selected from the group consisting of lithium, magnesium, aluminum, aluminum-lithium, calcium, magnesium-indium, and magnesium-silver.

22. The active matrix type organic electroluminescence device of claim 16, wherein the second electrode connecting terminal comprises aluminum.

23. The active matrix type organic electroluminescence device of claim 16, wherein the electric charge transfer layer comprises an electric charge transport layer.

24. The active matrix type organic electroluminescence device of claim 23, wherein the electric charge transport layer comprises a hole transport layer formed of at least one of N,N'-bis(3-methylphenyl)-N,N'-diphenyl-4,4'-diamine (TPD) and N,N'-di(naphthalene-1-yl)-N,N'-diphenyl-benxidine: α-NPD.

25. The active matrix type organic electroluminescence device of claim 23, wherein the electric charge transport layer comprises an electron transport layer formed of at least one of A-oxazole compounds, isooxazole compounds, triazole compounds, isothiazole compounds, oxadiazole compounds, thiadizole compounds, perylene compounds, aluminum complex, and gallium complex.

26. The active matrix type organic electroluminescence device of claim 16, wherein the electric charge transfer layer comprises an electric charge injection layer.

27. The active matrix type organic electroluminescence device of claim 26, wherein the electric charge injection layer comprises a hole injection layer formed of at least one of CuPu and a starburst type amine.

28. The active matrix type organic electroluminescence device of claim 26, wherein the electric charge injection layer is an electron injection layer formed of at least of LiF, NaCl, CsF, $Li_2O$, and BaO.

29. The active matrix type organic electroluminescence device of claim 28, further comprising a protective layer formed on the second electrode.

30. The active matrix type organic electroluminescence device of claim 16, further comprising:
a buffer layer formed on the substrate; and
an insulating layer;
wherein the first thin film transistor and the second thin film transistor are formed on the buffer layer and are covered by the insulating layer, and the first electrode is connected to the second thin film transistor through a contact hole formed in the insulating layer.

31. The active matrix type organic electroluminescence device of claim 16, further comprising:
a planarization layer; and
an insulating layer formed below the first electrode;
wherein the planarization layer is formed on portions of the first electrode and the insulating layer disposed outside of the display portion of the sub-pixel.

32. The active matrix type organic electroluminescence device of claim 16, wherein a gate electrode and a source electrode of the first thin film transistor, a source electrode of the second thin film transistor, and the second electrode are connected to the driving circuit, and a drain electrode of the first thin film transistor is connected to a gate electrode of the second thin film transistor.

33. The active matrix type organic electroluminescence device of claim 16, wherein the inorganic conductive intermediate layer comprises at least one of ITO, IZO, $In_2O_3$, and ZnO.

* * * * *